United States Patent [19]

Makino

[11] Patent Number: 5,004,521
[45] Date of Patent: Apr. 2, 1991

[54] METHOD OF MAKING A LEAD FRAME BY EMBOSSING, GRINDING AND ETCHING

[75] Inventor: Toru Makino, Shizuoka, Japan

[73] Assignee: Yamaha Corporation, Hamamatsu, Japan

[21] Appl. No.: 438,318

[22] Filed: Nov. 20, 1989

[30] Foreign Application Priority Data

Nov. 21, 1988 [JP] Japan .................. 63-294270
Nov. 21, 1988 [JP] Japan .................. 63-294271

[51] Int. Cl.⁵ .............................................. C23F 1/00
[52] U.S. Cl. ............................... 156/645; 156/656; 156/659.1; 156/637
[58] Field of Search ............... 156/644, 645, 651, 656, 156/659.1, 637; 51/293, 295, 309

[56] References Cited

U.S. PATENT DOCUMENTS

| | | | |
|---|---|---|---|
| 3,563,819 | 2/1971 | Rheingold et al. | 156/645 |
| 3,719,536 | 3/1973 | Rheingold et al. | 156/645 |
| 3,923,566 | 12/1975 | Law | 156/645 |
| 4,023,998 | 5/1977 | Cederberg et al. | 156/645 |
| 4,563,238 | 1/1986 | Rhoades | 156/645 |
| 4,600,470 | 7/1986 | Maynard et al. | 156/644 |
| 4,704,187 | 11/1987 | Fujita | 156/645 |

FOREIGN PATENT DOCUMENTS

| | | | |
|---|---|---|---|
| 52-3514 | 1/1977 | Japan | 156/645 |
| 53-36181 | 4/1978 | Japan | 156/645 |
| 61-119680 | 6/1986 | Japan . | |
| 622614 | 9/1978 | U.S.S.R. | 156/645 |
| 575657 | 2/1946 | United Kingdom | 156/645 |

*Primary Examiner*—Kenneth M. Schor
*Assistant Examiner*—John J. Bruckner
*Attorney, Agent, or Firm*—Burns, Doane, Swecker & Mathis

[57] ABSTRACT

A process of shaping a thin metal film into a lead frame starts with preparing a thin metal film, an etchant effective against the thin metal film and a photoresist solution resistive to the etchant, followed by coating the entire surface of the thin metal film with the photoresist solution so as to form a multiple level structure having the thin metal film and a photoresist film, and a predetermined pattern is embossed on the multiple level structure so as to break slits in the photoresist film along the periphery of the predetermined pattern, then removing a part of the multiple level structure by using the etchant so that a hollow space is formed therein in the predetermined pattern.

11 Claims, 4 Drawing Sheets

METHOD OF MAKING A LEAD FRAME BY EMBOSSING, GRINDING AND ETCHING

FIELD OF THE INVENTION

This invention relates to a lead frame for providing external connections between an integrated circuit and a conductive pattern on, for example, a circuit board and, more particularly, to a process of shaping a thin metal film into the lead frame.

BACKGROUND OF THE INVENTION

A lead frame is widely used in the assembly stage of the semiconductor manufacturing process, and the lead frame provides external connections between an integrated circuit and a conductive pattern formed on a circuit board.

A punching technique or lithographic techniques are applied to the formation of the lead frame. A blanking die unit is prepared for the punching process, and the blanking die unit usually consists of a punch and a die. The punch is movable into and out of the die, and a lead frame is partially cut out of a thin metal plate on the die.

On the other hand, the lithographic process starts with coating a thin metal film with a photoresist solution followed by an appropriate baking stage. The photoresist film thus provided on the thin metal film is exposed to an ultra-violet radiation through a mask, and the pattern formed in the mask is transferred to the photoresist film. When the photoresist film is partially removed through the development, the thin metal film is in part covered with the photoresist film, but is partially exposed. The thin metal film thus partially exposed is eroded in an etchant, and, consequently, the thin metal film is shaped into a lead frame.

However, a problem is encountered in the prior art with lead frames formed through the punching process in that the production cost is increased due to the preparation of the blanking die unit. The blanking die unit is usually made of a cemented carbide, and the ceramic carbide per se is very expensive and, for this reason, increases the production cost of the lead frame. Moreover, the blanking die unit needs a skilled worker, and plenty of time and labor is required to complete the precision blanking die unit. This further gives rise to increase the production cost of the blanking die unit and, accordingly, the production cost of the lead frame. Residual stress tends to take place in the blanking die unit due to the punching operation, and the blanking die unit suffers from a relatively short service time. This still further increases the production cost of the lead frame.

On the other hand, the lead frame formed through the lithographic process encounters a problem in a low throughput. This is because of the fact that an exposed part of the thin metal film should be perfectly etched away so as to form a predetermined slit pattern. If the etching is carried out from both sides of the thin metal film, the time period may be decreased by half. However, photoresist films are required on both sides of the thin metal film, and the formation of the dual photoresist films makes the process complicated and consumes plenty of time.

Moreover, a lot of inferior products tend to take place due to contamination, and the lithographic process suffers from a low production yield. Namely, the photoresist solution are liable to contain undesirable contaminators, and dust and particles fallen onto the photoresist film in the exposure stage. These contaminators, the dust and the particles are causative of producing pin holes in the lead frame during the etching stage, or, of an incomplete etching operation. This gives rise to a decrease in the production yield of the lead frame. If the working environment is improved, the undesirable contamination will be eliminated from the photoresist film. However, such a solution is extremely expensive, and gives rise to an increase in the production cost of the lead frame.

SUMMARY OF THE INVENTION

It is therefore an important object of the present invention to provide a process of shaping a thin metal film into a lead frame the cost of which is less expensive and, therefore, decreases the production cost of the lead frame.

It is another important object of the present invention to provide a process of shaping a thin metal film into a lead frame which consumes a relatively small amount of time to complete the lead frame.

It is also an important object of the present invention to provide that process of shaping a thin metal film into a lead frame which gives rise to an increase the production yield of the lead frame.

To accomplish these objects, the present invention proposes to emboss a predetermined pattern on a multiple level structure for exposing a metal plate through slits broken in a protective film produced in the embossing, so that a peripheral portion of a part of the thin metal film is eroded by the etchant to form a hollow space in the multiple level structure.

In accordance with the present invention, there is provided a process of shaping a thin metal film into a lead frame, comprising the steps of: (a) preparing a thin metal film, an etchant effective against the thin metal film and a protective material resistive to the etchant; (b) coating the entire surface of the thin metal film with the protective material so as to form a multiple level structure having the thin metal film and a protective film; (c) embossing a predetermined pattern on the multiple level structure so as to break slits in the protective film along the peripheral of the predetermined pattern; and (d) removing a part of the multiple level structure by using the etchant so that a hollow space is formed therein in the predetermined pattern.

BRIEF DESCRIPTION OF THE DRAWINGS

The feature and advantages of a process of shaping a thin metal film into a lead frame according to the present invention will be more clearly understood from the following description taken in conjunction with the accompanying drawings in which.

DESCRIPTION OF THE PREFERRED EMBODIMENTS

First Embodiment

Figure 1A:
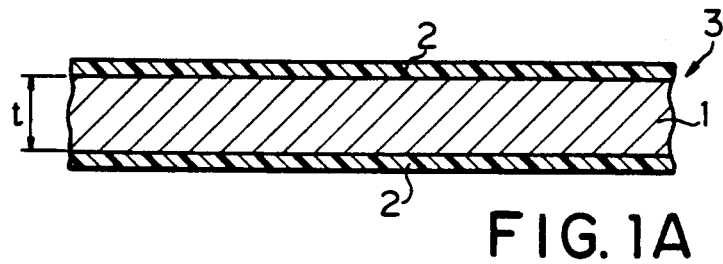
FIGS. 1A to 1C are cross sectional views showing a process sequence according to the present invention.
Figure 1B:
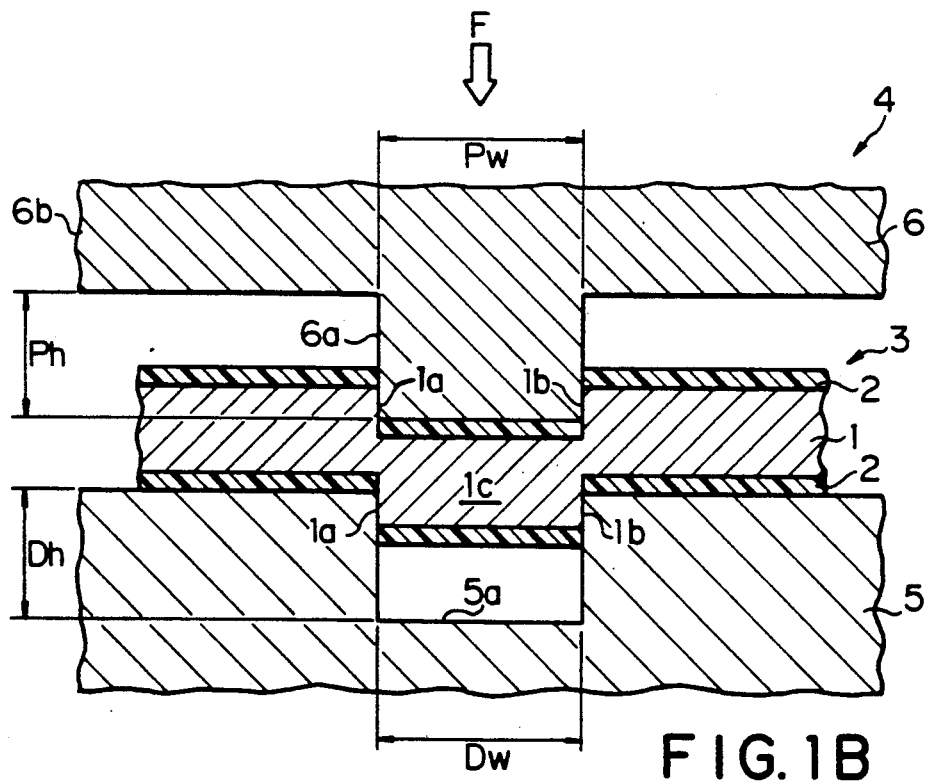
Figure 1C:
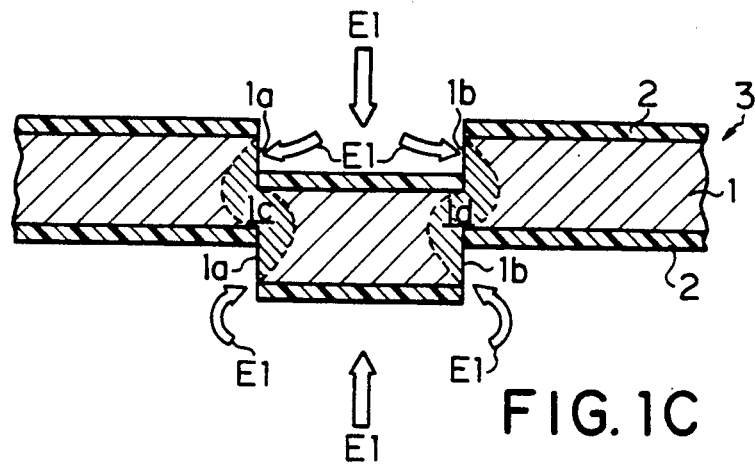

Referring first to FIGS. 1A to 1C, a process embodying the present invention starts with preparation of a thin metal film 1 of copper, a photoresist solution, an etchant against copper and a die unit. In this instance, the etchant is of a second ion chloride solution, however, the etchant may contain iron chloride or copper chloride. Concretely, iron (III) chloride or copper (II) chloride is chosen for decreasing the etching time period. The thin metal film may be formed of a substance selected from the group consisting of copper alloys, a steel, iron alloys, nickel, nickel alloys and another conductive material, and the etchant should be able to erode the thin metal film. The photoresist may be "KMER" of Eastman Kodak, "OMR" of Tokyo Applied Chemical Industry of "AZ" to Shipley Microelectronicsm, however any material is available as a protective material in so far as it is resistive to the etchant. The thin film 1 has a thickness t ranging from 0.1 millimeter to about 0.5 millimeter, and the photoresist solution is applied to the entire surface of the thin metal film 1 so that a photoresist film 2 covers the entire surface of the thin metal film 1 as shown in FIG. 1A. The thin metal film 1 covered with the photoresist film 2 is hereinunder referred to as "multiple level structure". If a metal resistive to the etchant is selected to form the protective film instead of the photoresist, a target of the metal is sputtered onto the thin metal film. A plating bath system may be also available for formation of the protective film.

The formation of the photoresist film 2 is followed by an embossing stage. Namely, the multiple level structure 3 is placed into die unit 4 associated with an actuator (not shown). The die unit 4 has a die 5 fixedly supported by a retainer (not shown) and a punch 6 movable into or out of the die 5. A recess 5a is formed in the die 5, and is shaped into a predetermined pattern. On the other hand, the punch 6 is formed with a land portion 6a projecting from the boss portion 6b, and the land portion 6a has a cross section shaped into the predetermined pattern as similar to a relief printing board. The predetermined pattern defines cut-out portions so as to form a die pad as well as leads of the lead frame. In this instance, the land portion 6a is approximately equal in height to the thickness t of the thin metal film 1, and the depth of the recess 5a is also approximately equal to the thickness t. The land portion 6a is as wide as the recess 5a, however, the width Pw of the land portion may be slightly smaller than the width Dw of the recess in another implementation.

When the multiple level structure 3 is moved onto the die 5, the actuator causes the punch to move toward the multiple level structure 3 as indicated by an arrow F, and presses the multiple level structure 3 against the die. With a shearing force, the multiple level structure 3 is partially pushed into the recess 5a, and the land portion 6a of the punch 6 breaks slits in the photoresist film 2. However, after the land portion 6a is brought into abutting engagement with the multiple level structure 3, the punch travels by a certain stroke less than the thickness t, and, for this reason, the predetermined pattern is produced in relief. Since the slits are broken in the photoresist film 2, shearing surfaces 1a and 1b of the thin metal film 1 are exposed through the photoresist film 2 as shown in FIG. 1B. The portion between the shearing surfaces 1a and 1b is hereinunder referred to as "relief portion 1c". Thus, the multiple level structure 3 is merely deformed by the die unit 4, and the die unit 4 is hardly damaged. This is conducive to prolonging the service time of the die unit 4. Moreover, it is not necessary to precisely align the land portion with the recess 5a, because the die unit 4 merely embosses the predetermined pattern on the multiple level structure 3 The rough alignment results in reduction of the production cost of the die unit 3, which in turn results in decreasing the production cost of the lead frame. As described above, the land portion 6a merely travels a short distance after the abutting engagement with the multiple level structure 3, and, for this reason, the land portion 6a is large in buckling strength The land portion 6a with the large buckling strength allows a miniature pattern geometry, and the miniature pattern geometry increases the number of the leads incorporated in the lead frame.

In this process, the die unit is used for embossing, however, various metallic molds are available.

Subsequently, the multiple level structure 3 is dipped into the etching solution, and the etchant directly attacks the exposed shearing surfaces 1a and 1b as indicated by arrows E1. The etching solution gradually erodes the copper, and, accordingly, shallow recesses 1c and 1d are formed in the thin metal film 1. The shallow recesses 1c and 1d finally separate the relief part from the multiple level structure. A time period consumed in the etching stage is shorter than the prior art etching stage, because the amount of the volume etched is smaller than the amount of the relief portion. The reduction in the amount of the volume etched is further prolong the life time of the etching solution, and, for this reason, this decreases the production cost of the lead frame. Moreover, the thin metal film 1 is decreased in effective thickness through the embossing, and the etchant attacks the thin metal film 1 from both sides thereof, so that the time period consumed in the etching stage is further reduced in comparison with the prior art process. The resultant structure of this stage is shown in FIG. 1c.

When the photoresist film 2 is stripped off, a hollow space with the predetermined pattern is formed in the thin metal film 1. A burr is hardly produced along the edge due to the etching, and a trimming operation may be eliminated from the process sequence. The smooth edge profile allows the predetermined pattern to be completed.

Figure 2:
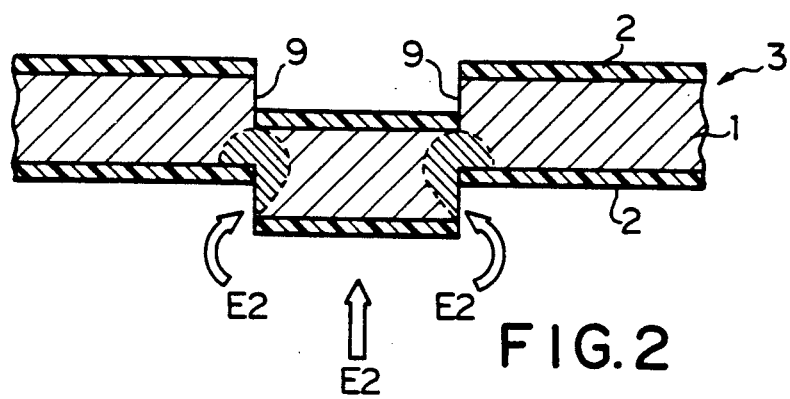
FIG. 2 is a cross sectional view showing another etching stage forming a part of a process sequence according to the present invention.
Figure 3A:
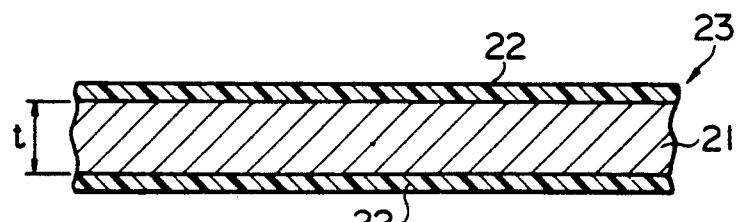
FIGS. 3A to 3D are cross sectional views showing still another process sequence according to the present invention.

In this process, the multiple level structure is dipped into the etching solution, however, the etching solution is sprayed over the multiple level structure. Turning to FIG. 2 of the drawings, the multiple level structure 3 is placed under spray nozzles (not shown), and the etching solution is sprayed over the multiple level structure 3. The etching solution attacks the exposed shearing surfaces on one side of the thin metal film 1 as indicated by arrows E2, so that an edge 9 is kept sharp, and an geometrical error is less liable to take place Second Embodiment Turning to FIGS. 3A to 3C, another process sequence according to the present invention is illustrated. The process starts with prepartions of a thin metal film of copper, an etching solution against the copper, a photoresist solution, a die unit and a grinding machine. The thin metal film is about 0.1 millimeter to about 0.5 millimeter thick. First, the photoresist solution is spread over the entire surface of the thin metal film 21, and the thin metal film 21 is coated with a photoresist film 22. The resultant structure is hereinunder referred to as "multiple level structure 23", and is illustrated in FIG. 3A.

The multiple level structure 23 is placed on a die 24 which is provided in association with a punch 25, and the die 24 and the punch 25 form in combination a die unit 26. The die 24 is formed with a recess 24a, and the punch 25 has a land portion 25a. The height Ph of the land portion 25a as well as the depth Dh of the recess 24a are adjusted to the thickness t of the thin metal film 21, and the land portion 25a and the recess 24a have respective cross sections identical with a predetermined configuration. The land portion 25a is as wide as the recess 24a, however, the width Pw of the land portion may be slightly narrower than the width Dw of the recess 24a in another implementation.

Figure 3B:
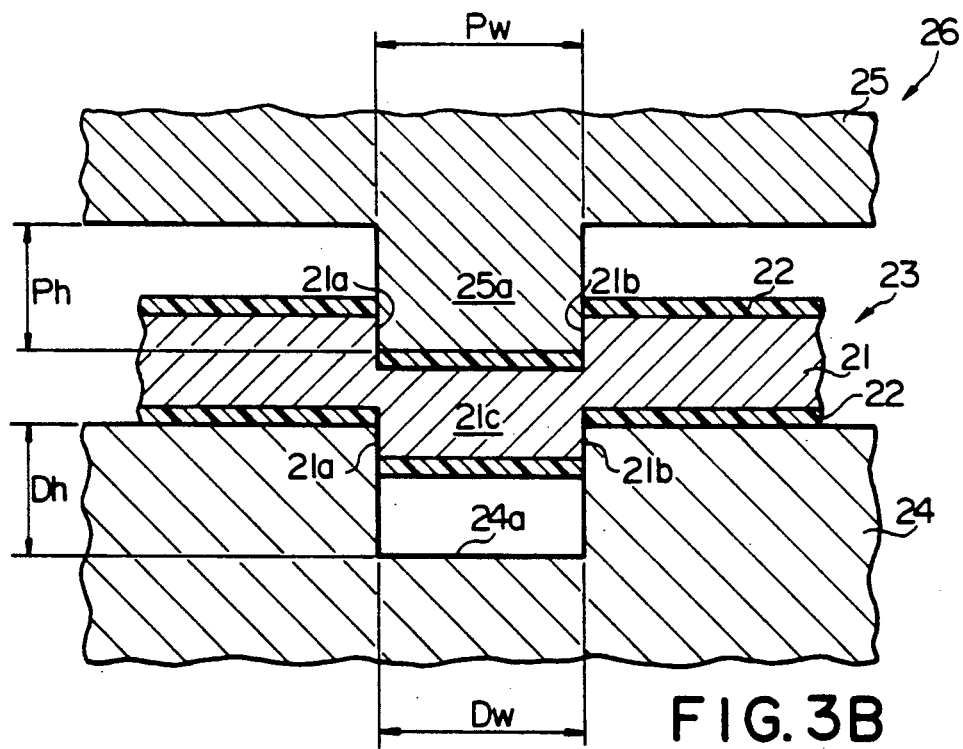

The punch 25 is reciprocally moved toward the die 24 by an actuator (not shown), so that the land portion 25a is brought into abutting engagement with the multiple level structure 23. After the abutting engagement with the multiple level structure 23, the punch 25 slightly advances in the downward direction, and, for this reason, the multiple level structure 23 is subjected to a shearing force, thereby being partially pushed into the recess 24a. When the multiple level structure 23 is partially pushed into the recess, the land portion 25a breaks slits in the photoresist film 22 along the edge thereof, and shearing surfaces 21a and 21b are in part exposed through the slits. The portion between the shearing surfaces 21a and 21b is hereinunder referred to as "relief portion 21c". The resultant structure of this stage is illustrated in FIG. 3B.

Figure 3C:
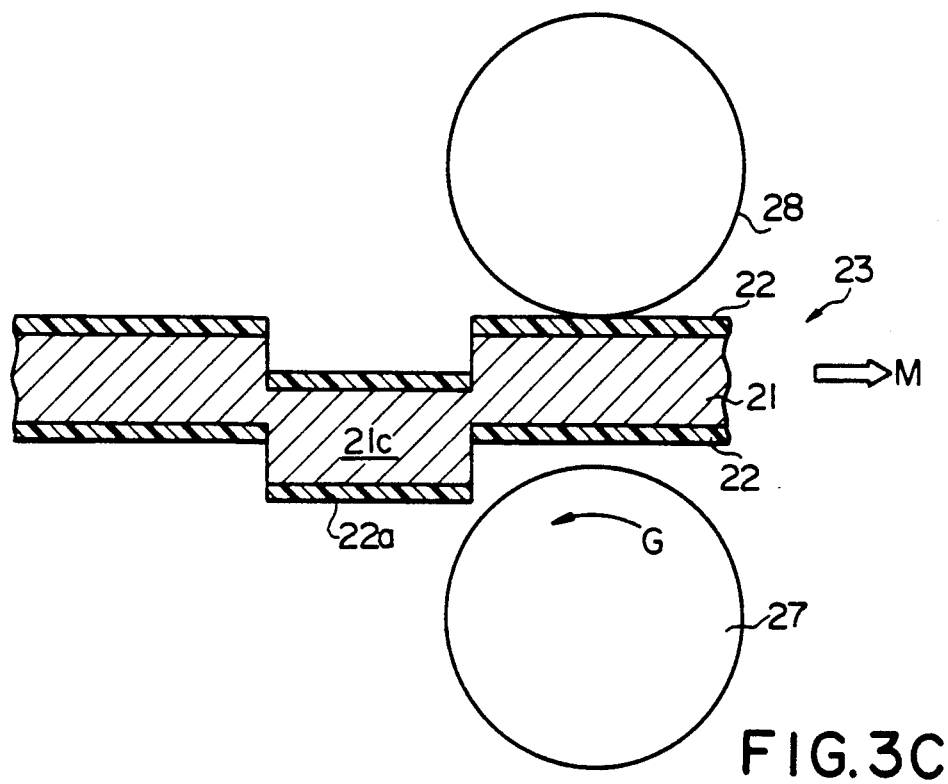

The embossing stage is followed by a grinding stage. The multiple level structure 23 thus deformed is fed to a grinding machine as shown in FIG. 3C, and a grindstone 27 and a guide roller 28 are faced to one another in a spacing relationship so that a gap is produced therebetween. The grindstone 27 is driven for rotation in the counter clockwise direction as indicated by an arrow G, and the multiple level structure 23 travels through the gap in a direction indicated by an arrow M. The gap is adjusted to a certain distance smaller than the thickness of the multiple level structure 23 by the thickness of the photoresist film 22, and, for this reason, the photoresist film 22a on the relief portion 21c is grinded by the grindstone 27.

Figure 3D:
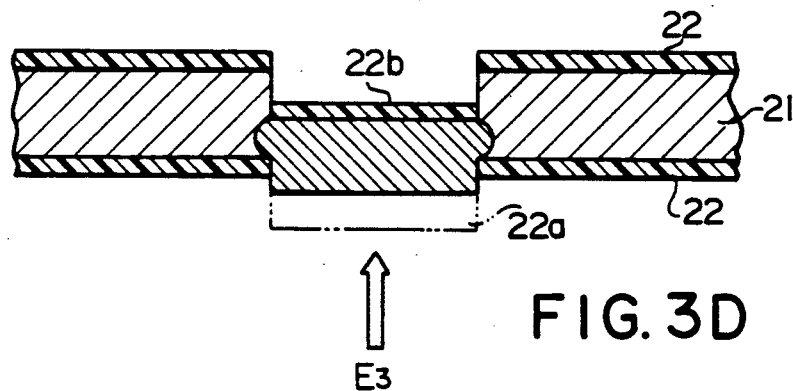

When the photoresist film 22a is removed, the multiple level structure 23 is exposed to the etchant, and the etchant directly attacks the relief portion 21c as indicated by an arrow E3, because no protection film is applied to the relief portion 21c. The erosion inwardly proceeds until the etching profile reaches the photoresist film 22b on the opposite side to the removed photoresist film 22a. The resultant structure of this stage is illustrated in FIG. 3D. When the residual photoresist film 22 is stripped off, the lead frame is completed.

In this instance, the die unit 26 is of the blanking die unit, however, another kind of die unit is available for the embossing.

As will be understood from the foregoing description, a relatively small amount of time period is consumed in the etching stage, because the effective thickness of the thin metal film 21 is decreased in the embossing. This results in increasing the throughput of the shaping process. The embossing further results in prolonging the life time of the etchant due to the reduction in the amount of the eroded metal. Since the punch 25 merely deforms the multiple level structure, the punch 25 is hardly damaged and, accordingly, prolonged in the service time period. Moreover, the edge profile of the lead frame is relatively mellow, because the relief portion 21c is separated from the thin metal film 21 by the erosion, and the mellow edge profile allows a miniature and complex pattern. The land portion 25a is relatively low in height, and, for this reason, has a large buckling strength. This further miniaturizes the predetermined pattern.

Although particular embodiment of the present invention have been shown and described, it will be obvious to those skilled in the art that various changes and modifications may be made without departing from the spirit and scope of the present invention.

What is claimed is:

1. A process of shaping a thin metal film into a lead frame, comprising the steps of:
   (a) preparing a thin metal film, an etchant effective to etch the metal film and a protective material resistive to etching by the etchant;
   (b) coating the entire surface of said metal film with a film of said protective material having a thickness, so as to form a multiple level structure having the metal film and a protective film;
   (c) embossing a predetermined pattern on said multiple level structure by displacing a part of said multiple level structure, the distance of said displacement being greater than the thickness of said protective film so as to thereby break slits in said protective film, said slits exposing said metal film, said slits being substantially consistent with a profile of said predetermined pattern; and
   (d) removing said part of said multiple level structure by grinding a portion of said protective material from said part, and then using said etchant to etch a hollow space in said metal film of said multiple level structure, by etching said metal film to the extent that a profile of said hollow space is substantially consistent with the profile of said predetermined pattern.

2. A process of shaping a metal film into a lead frame as set forth in claim 1, in which said metal film is formed of a conductive material.

3. A process of shaping a metal film into a lead frame as set forth in claim 2, in which said conductive material is selected from the group consisting of copper, copper alloys, iron alloys, nickel and nickel alloys.

4. A process of shaping a metal film into a lead frame as set forth in claim 2, in which the thickness of said metal film is from about 0.1 millimeter to about 0.5 millimeter.

5. A process of shaping a metal film into a lead frame as set forth in claim 1, said protective film being formed of a substance selected from a group consisting of photoresists and metals etched less readily than said metal film.

6. A process of shaping a metal film as set forth in claim 1, in which said etchant is a solution containing a copper chloride or an iron chloride 7. A process of shaping a metal film into a lead frame as set forth in claim 1, in which said step of embossing a predetermined pattern is carried out by pressing said multiple level structure into a die using a punch.

8. A process of shaping a film into a lead frame as set forth in claim 1, in which, to carry out the etching, said multiple level structure is dipped into said etchant so that the part of the multiple level structure is removed.

9. A process of shaping a thin film into a lead frame as set forth in claim 1, in which, to carry out the etching, said etchant is sprayed over said multiple level structure so that the part of the multiple level structure is removed.

10. A process of shaping a thin metal film into a lead frame, comprising the steps of:
 (a) preparing a thin metal film, an etchant effective to etch the metal film and a protective material resistive to etching by the etchant;
 (b) coating the entire surface of said metal film with a film of said protective material having a thickness, so as to form a multiple level structure having the metal film and a protective film;
 (c) embossing a predetermined pattern on said multiple level structure by displacing a part of said multiple level structure, the distance of said displacement being greater than the thickness of said protective film so as to thereby break slits in said protective film, said slits exposing said metal film, said slits being substantially consistent with a profile of said predetermined pattern; and,
 (d) removing said part of said multiple level structure by using said etchant so that a hollow space is formed therein, a profile of said hollow space being substantially consistent with the profile of said predetermined pattern, said step of removing said part of said multiple lever structure comprising the sub-steps of:
 grinding away a part of said protective film on a surface of a part of said metal film to be etched so that said surface of said part of said metal film is thereby exposed; and, then
 etching said part of said multiple level structure not covered by said protective film to remove a portion of said metal film.

11. A process of shaping a metal film into a lead frame as set forth in claim 10, in which of said protective film is ground away by using a grindstone.

* * * * *